United States Patent
Goh et al.

(10) Patent No.: US 9,907,170 B2
(45) Date of Patent: Feb. 27, 2018

(54) FPC CONNECTOR FOR BETTER SIGNAL INTEGRITY AND DESIGN COMPACTION

(71) Applicant: Intel Corporation, Santa Clara, CA (US)

(72) Inventors: Eng Huat Goh, Penang (MY); Hoay Tien Teoh, Paya Terubong (MY)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 15/037,856

(22) PCT Filed: Jul. 1, 2015

(86) PCT No.: PCT/US2015/038758
§ 371 (c)(1),
(2) Date: May 19, 2016

(87) PCT Pub. No.: WO2017/003474
PCT Pub. Date: Jan. 5, 2017

(65) Prior Publication Data
US 2017/0181281 A1    Jun. 22, 2017

(51) Int. Cl.
*H01R 12/70*    (2011.01)
*H01R 12/78*    (2011.01)
(Continued)

(52) U.S. Cl.
CPC .......... *H05K 1/14* (2013.01); *H01R 12/7058* (2013.01); *H01R 12/78* (2013.01); *H05K 1/028* (2013.01);
(Continued)

(58) Field of Classification Search
None
See application file for complete search history.

(56) References Cited

U.S. PATENT DOCUMENTS 3,763,307 A * 10/1973 Wolf ................. H01B 7/0846
                                                174/117 FF
4,936,792 A *  6/1990 Onoue ............... H01R 12/79
                                                439/329
(Continued)

FOREIGN PATENT DOCUMENTS

JP    2005285409 A    10/2005
JP    2010040199 A     2/2010
JP    2013008443 A     1/2013

OTHER PUBLICATIONS

"International Application Serial No. PCT/US2015/038758, International Search Report dated Mar. 29, 2016", 3 pgs.
(Continued)

*Primary Examiner* — Xanthia C Cunningham
(74) *Attorney, Agent, or Firm* — Schwegman Lundberg & Woessner, P.A.

(57) ABSTRACT

A computer system assembly that includes a substrate and a first board mounted on the substrate. A flexible cable is secured to the first board. The computer system assembly further includes a second board mounted on the substrate. The second board includes a FPC connector. The FPC connector includes a body having a channel extending through the body such that the flexible cable may be positioned in the channel and pulled entirely through the body of the FPC connector. The FPC connector further includes a latching mechanism that secures the flexible cable within the channel once the flexible cable is pulled through the FPC connector. The first board and the second board are moved closer together as the flex cable is pulled through the FPC connector before at least one of the first board and the second board is mounted on the substrate.

16 Claims, 8 Drawing Sheets

(51) Int. Cl.
  *H05K 1/14* (2006.01)
  *H05K 1/02* (2006.01)
(52) U.S. Cl.
  CPC .............. *H05K 2201/10037* (2013.01); *H05K 2201/10356* (2013.01)

(56) References Cited

U.S. PATENT DOCUMENTS

| | | | | |
|---|---|---|---|---|
| 5,195,897 A * | 3/1993 | Kent | ........................ | H01R 12/79 439/267 |
| 5,482,473 A * | 1/1996 | Lord | ..................... | H01R 12/774 439/67 |
| 6,139,360 A * | 10/2000 | Hayashi | .................. | H05K 1/148 439/502 |
| 6,508,674 B1 * | 1/2003 | Svenkeson | ........... | H01R 12/592 439/61 |
| 6,699,395 B1 * | 3/2004 | Svenkeson | ........... | H01R 23/667 216/100 |
| 6,855,002 B2 * | 2/2005 | Chiu | ..................... | H01R 12/771 439/495 |
| 7,690,923 B2 * | 4/2010 | Horchler | ................. | H01R 12/79 439/67 |
| 7,905,747 B2 * | 3/2011 | Suzuki | .................. | H01R 12/771 439/260 |
| 8,380,022 B2 * | 2/2013 | Uemura | ................ | G02B 6/4249 385/14 |
| 8,508,946 B2 * | 8/2013 | Ching | ..................... | H01R 12/79 361/737 |
| 9,178,297 B2 * | 11/2015 | Kodaira | ................ | H01R 12/774 |
| 2003/0073345 A1 * | 4/2003 | LePottier | ................ | H01R 12/79 439/496 |
| 2003/0092310 A1 | 5/2003 | Kunishi et al. | | |
| 2005/0266725 A1 * | 12/2005 | Pabst | ...................... | H01R 12/61 439/494 |
| 2006/0035515 A1 * | 2/2006 | Pabst | ...................... | H01R 12/88 439/492 |
| 2008/0305677 A1 * | 12/2008 | Koga | ..................... | H01R 12/79 439/492 |
| 2009/0041408 A1 * | 2/2009 | Kondo | ..................... | G02B 6/43 385/14 |
| 2010/0075529 A1 * | 3/2010 | Niitsu | .................. | H01R 12/79 439/377 |
| 2010/0075541 A1 * | 3/2010 | Niitsu | .................. | H01R 12/774 439/658 |
| 2010/0304591 A1 | 12/2010 | Ishishita et al. | | |
| 2014/0113484 A1 * | 4/2014 | Chen | ..................... | H01R 12/79 439/492 |
| 2015/0214644 A1 * | 7/2015 | Chang | .................. | H01R 12/594 439/498 |
| 2015/0326981 A1 * | 11/2015 | Bergner | ................ | H04R 25/00 381/312 |
| 2016/0100478 A1 * | 4/2016 | Lee | ..................... | H04M 1/0202 361/749 |

OTHER PUBLICATIONS

"International Application Serial No. PCT/US2015/038758, Written Opinion dated Mar. 29, 2016", 9 pgs.

* cited by examiner

FPC CONNECTOR FOR BETTER SIGNAL INTEGRITY AND DESIGN COMPACTION

This application is a U.S. National Stage Application under 35 U.S.C. 371 from International Application No. PCT/US2015/038758, filed Jul. 1, 2015, which is hereby incorporated by reference in its entirety.

BACKGROUND

Figure 1:
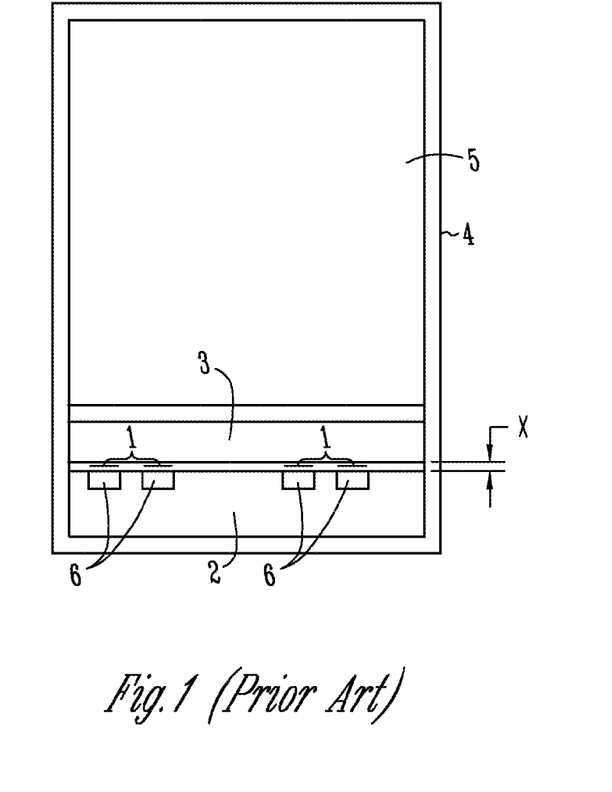
FIG. 1 is a top view illustrating a prior art computer system assembly.

As shown in FIG. 1, multiple flex cables 1 are typically used to form electrical connections between Direct Chip Attached (DCA) electronic packages 2 and IO boards 3. The use of relatively short flex cables 1 is desirable for two main reasons.

Figure 2:
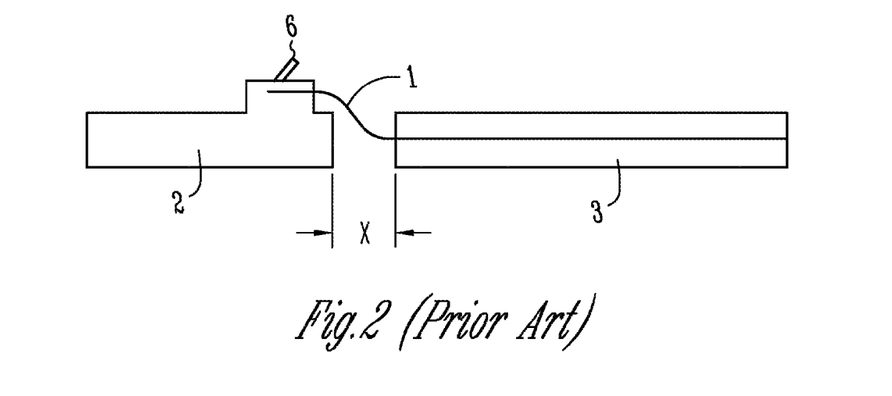
FIG. 2 is a side view of the prior art computer assembly shown in FIG. 1.

One reason is to maximize system battery life. The DCA electronic package 2 and the IO board 3 are required to be side by side. The further the DCA electronic package 2 and the IO board 3 are separated, the more space is required on an underlying substrate 4 (e.g., a motherboard). As more space is required on the underlying substrate 4 (see, e.g., dimension X in FIGS. 1 and 2), less space is left for a battery 5. Therefore, the battery 5 must be made smaller in order to accommodate the reduced space, which results in less battery life as compared to using a larger battery.

Another reason to use of relatively short flex cables 1 is for better signal integrity performance. Flex cables 1 are relatively high signal loss cables such that there is typically a maximum allowed length in order for the flex cable 1 to adequately carry high speed signals.

However, the desire of having a short flex cable makes system assembly quite difficult. The use of a short flex cable (e.g., ~10 min or less) in conjunction with a flexible printed circuit (hereafter FPC) connector(s) 6 is so challenging that it has historically not been practical for high volume manufacturing (HVM). In addition, many conventional flex cables 1 need to include 3 (or more) layers in order to meet signal integrity requirements. As an example, many conventional flex cables 1 need multiple layers in order to enable strapline design for signals passing through the layers of flex cable 1. Adding more layers to the flex cable 1 can make system assembly even more problematic as adding more layers makes the flex cable 1 less flexible for bending during system assembly.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The example FPC connectors described herein may alleviate some of the challenges that are associated with utilizing short (e.g., 10-15 mm) flex cable in order signal integrity quality) in small form factor electronic assemblies. The example FPC connectors described herein are configured such that a flex cable which is inserted into the FPC connector may be pulled through the FPC connector from the backside of the FPC connector.

Figure 11:
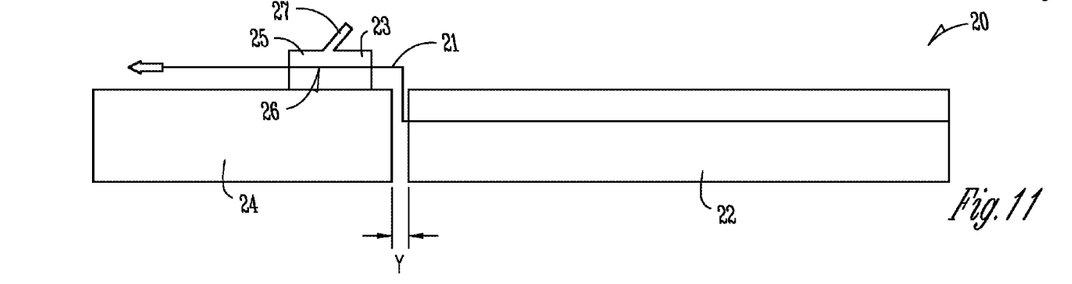
FIG. 11 shows a side view of the example partial electronic assembly of FIGS. 9 and 10 where the flex cable is pulled fully through the FPC connector on the second board.
Figure 14:
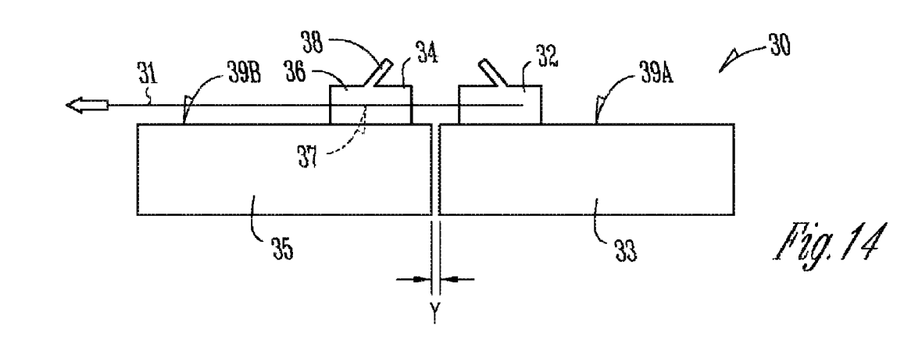
FIG. 14 shows a side view of the example partial electronic assembly of FIGS. 12 and 13 where the flex cable is pulled fully through the FPC connector on the second board.
Figure 15:
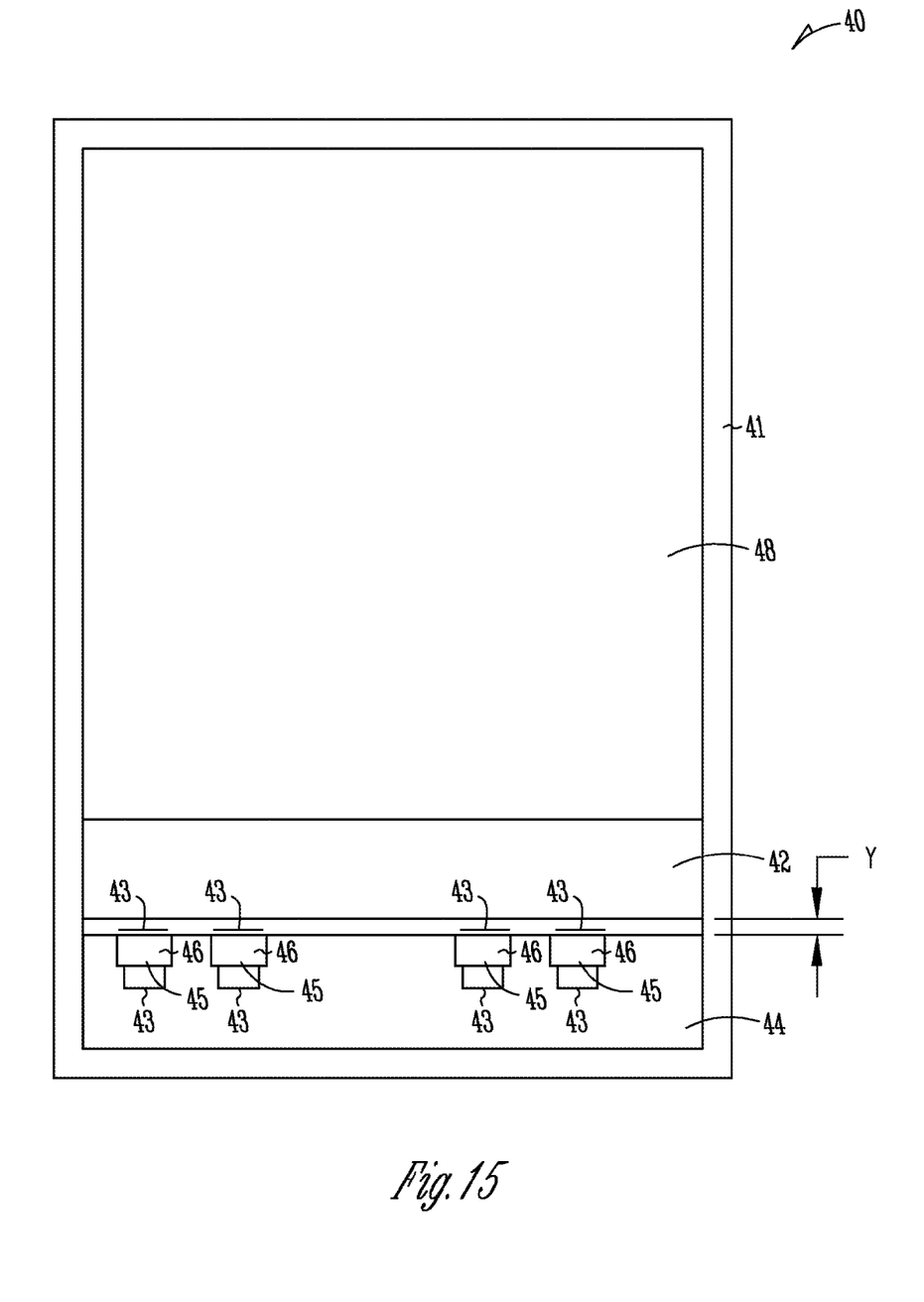
FIG. 15 is a top view illustrating an example computer system assembly.

The flex cable may be pulled through the FPC connector (e.g., from a backside of the FPC connector) until the two boards that are electrically connected together by the flex cable may be positioned quite close to one another (see, e.g., dimension Y in FIGS. 11, 14 and 15). Positioning the two boards that are electrically connected together by the flex cable closer together may (i) improve signal integrity between the two boards; and/or (i) achieve smaller form factors for the electronic assemblies that utilize the two adjacent boards.

Figure 3:
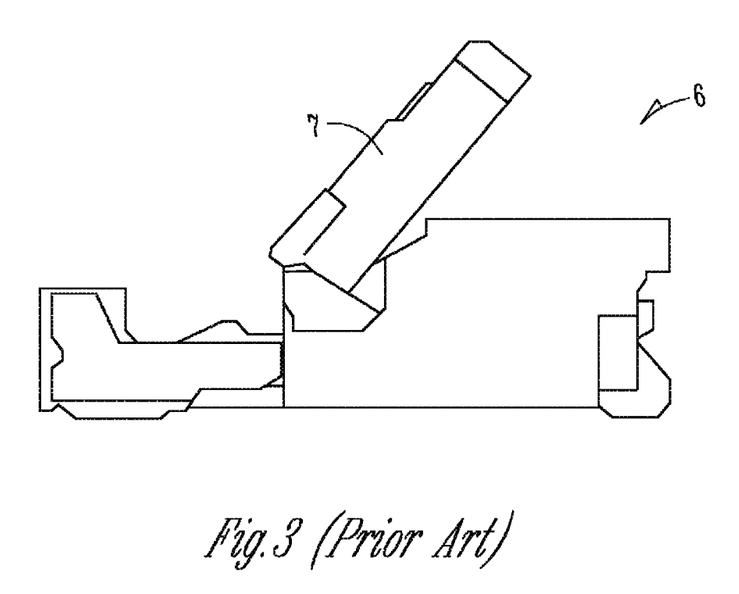
FIG. 3 shows a side view of a prior art FPC connector.
Figure 5:
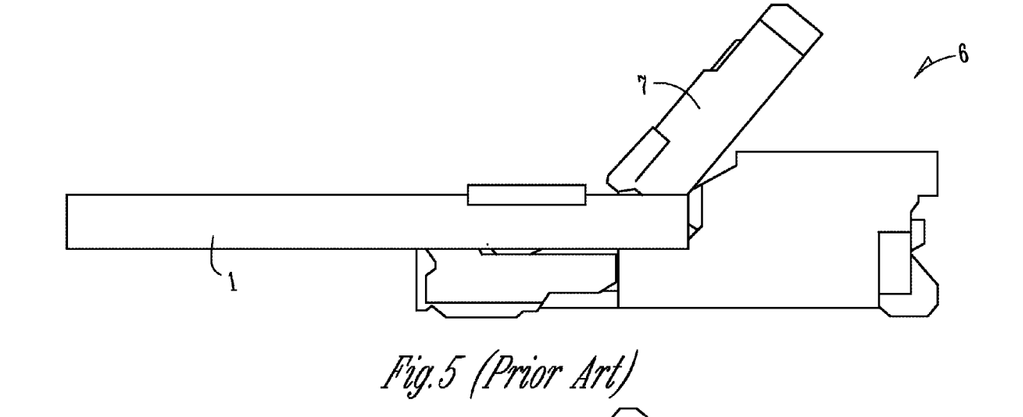
FIG. 5 illustrates a side view of the prior art FPC connector shown in FIG. 3 with a latch of the FPC connector open and flex cable inserted into the FPC connector.
Figure 7:
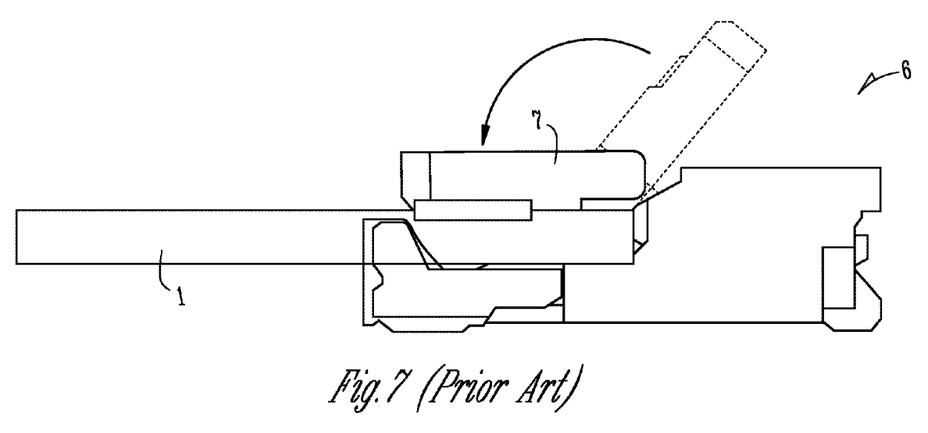
FIG. 7 illustrates a side view of the prior art FPC connector shown in FIGS. 3 and 5 with a latch of the FPC connector closed and flex cable inserted into the FPC connector.

FIG. 3 shows a side view of a prior art FPC connector 6. FIG. 5 illustrates a side view of the prior art FPC connector 6 shown in FIG. 3 with a latch 7 of the FPC connector 6 open and flex cable 1 inserted into the FPC connector 6. FIG. 7 illustrates a side view of the prior art FPC connector 6 shown in FIGS. 3 and 5 with a latch 7 of the FPC connector 6 closed and flex cable 1 inserted into the FPC connector 6.

Figure 4:
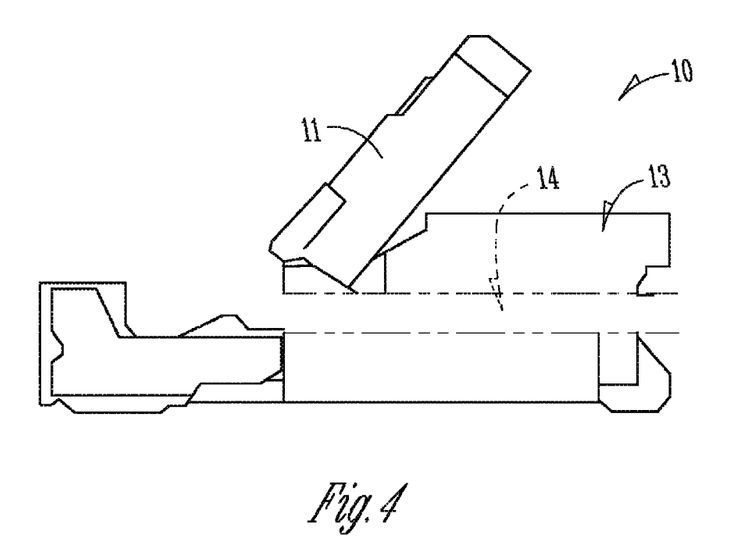
FIG. 4 shows a side view of an example FPC connector.
Figure 6:
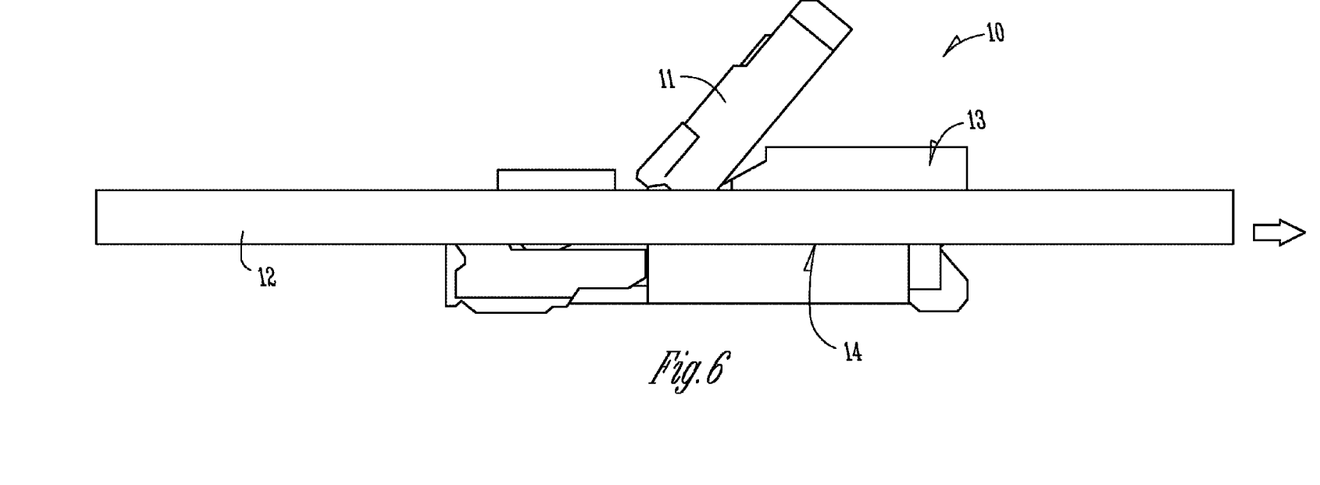
FIG. 6 illustrates a side view of the FPC connector shown in FIG. 4 with a latch of the FPC connector open and flex cable inserted through the FPC connector.
Figure 8:
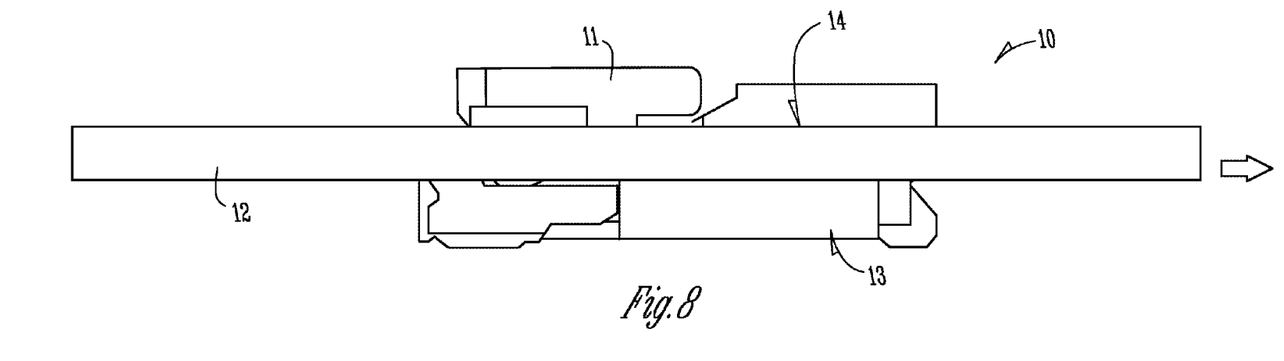
FIG. 8 illustrates a side view of the FPC connector shown in FIGS. 4 and 6 with a latch of the FPC connector closed and flex cable inserted through the FPC connector.

FIG. 4 shows a side view of an example FPC connector 10. FIG. 6 illustrates a side view of the FPC connector 10 shown in FIG. 4 with a latch 11 of the FPC connector 10 open and flex cable 12 inserted through the FPC connector 10. FIG. 8 illustrates a side view of the FPC connector 10 shown in FIGS. 4 and 6 with the latch 11 of the FPC connector 10 closed and flex cable 12 inserted through the FPC connector 10.

As shown in FIGS. 4, 6 and 8, the FPC connector 10 includes a body 13. The body 13 includes a channel 14 that extends through the body 13 such that the flexible cable 12 may be positioned in the channel 14 and pulled entirely through the body 13 of the FPC connector 10. The FPC connector 10 further includes a latching mechanism (e.g., latch 11) that is configured to secure the flexible cable 12 within the channel 13 once the flexible cable 12 is pulled through the FPC connector 10.

In some forms, the channel 14 is a rectangular-shaped opening and/or the latching mechanism may include a rotating member that secures the flexible cable 12 (e.g., see FIG. 8). In addition, the latching mechanism may be configured to apply a compressive force to the flexible cable 12 positioned within the channel 14. It should be noted that any type of latching mechanism that is known now, or discovered in the future, may be used in the FPC connector 10.

Figures 9, 10:
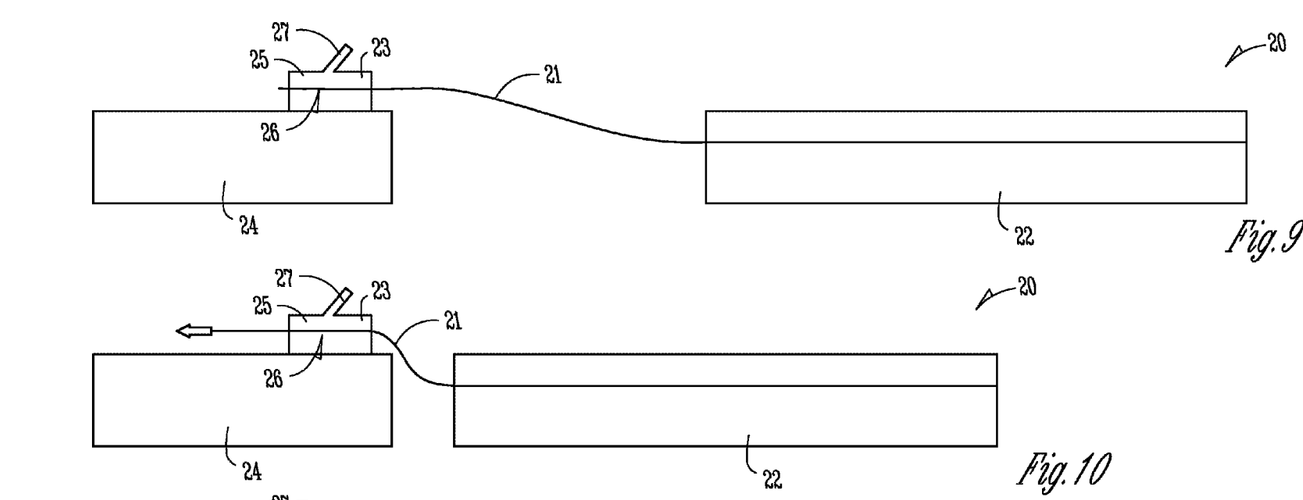
FIG. 9 shows a side view of an example partial electronic assembly where the flex cable from one board is just being inserted into a FPC connector on a second board.
FIG. 10 shows a side view of the example partial electronic assembly of FIG. 9 where the flex cable is partially pulled through the FPC connector on the second board.

FIG. 9 shows a side view of an example partial electronic assembly 20 where the flex cable 21 from one board 22 is just being inserted into a FPC connector 23 on a second board 24. FIG. 10 shows a side view of the example partial electronic assembly 20 of FIG. 9 where the flex cable 21 is partially pulled through the FPC connector 23 on the second board 24. FIG. 11 shows a side view of the example partial electronic assembly 20 of FIGS. 9 and 10 where the flex cable 21 is pulled fully through the FPC connector 23 on the second board 24.

The flex cable 21 extending from first board 22 may be relatively short as compared to conventional flex cable 21 in order to facilitate fabrication of the partial electronic assembly 20. Fabrication of the partial electronic assembly 20 is facilitated because the flex cable 21 can be pulled from the opposite side of the FPC connector 23 to the side where the flex cable 21 is inserted into the FPC connector 23. FIG. 11 shows that the length of the flex cable 21 between the first board 22 and the FPC connector 23 on the second board 24 is minimized (see, e.g., dimension Y in FIG. 11) such that the partial electronic assembly 20 has the ability to maintain strong signal integrity between the first board 22 and the second board 24.

As shown in FIGS. 9-11, the partial electronic assembly 20 includes a first board 22 that include a flexible cable 21 within the first board 22. The partial electronic assembly 20 further includes a second board 24 that includes an FPC connector 23. The FPC connector 23 includes a body 25 having a channel 26 extending through the body 25 such that the flexible cable 21 may be positioned in the channel 26 and pulled entirely through the body 25 of the FPC connector 23. The FPC connector 23 further includes a latching mechanism 27 that secures the flexible cable 21 within the channel 26 once the flexible cable 21 is pulled through the FPC connector 23 to bring the first board 22 and the second board 24 together.

In some forms, the first board 22 may an I/O board and/or the second board 24 may be a DCA electronic package. In addition, the channel 26 may be a rectangular-shaped opening, although other shapes for channel 26 are contemplated.

The latching mechanism 27 may include a rotating member that secures the flexible cable 21. The latching mechanism 27 may apply a compressive force to the flexible cable 21 positioned within the channel 26 when the latching mechanism 27 secures the flexible cable 21. It should be noted that any type of latching mechanism 27 that is known now, or discovered in the future, may be used in the partial electronic assembly 20.

Figure 12:
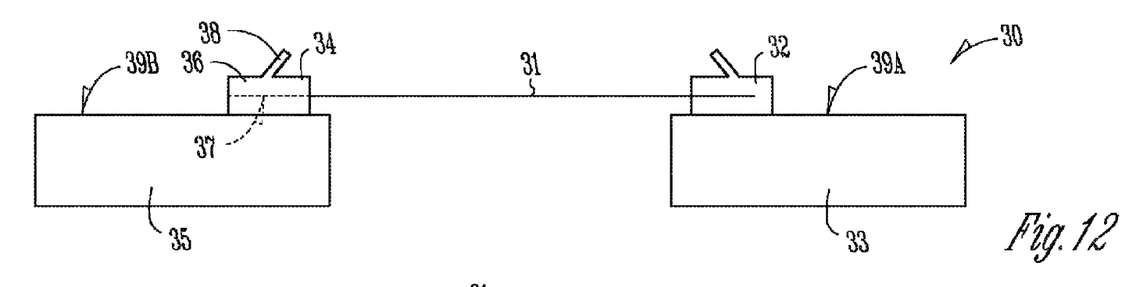
FIG. 12 shows a side view of another example partial electronic assembly where the flex cable from one hoard is just being inserted into a FPC connector on a second board.
Figure 13:
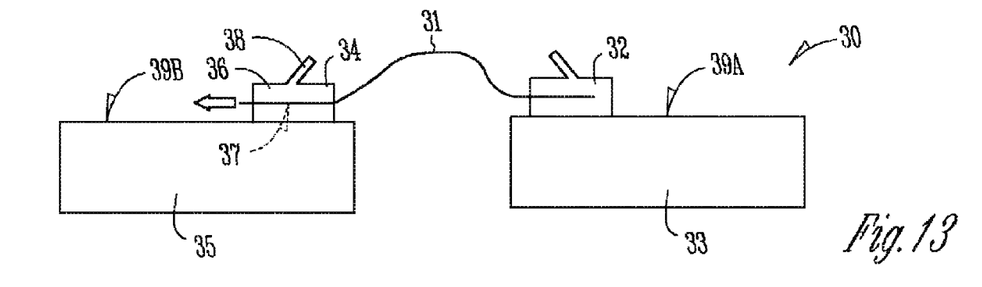
FIG. 13 shows a side view of the example partial electronic assembly of FIG. 12 where the flex cable is partially pulled through the FPC connector on the second board.

FIG. 12 shows a side view of another example partial electronic assembly 30 where a flex cable 31 that is attached to a first FPC connector 32 on one board 33 is just being inserted into a second FPC connector 34 on a second board 35. FIG. 13 shows a side view of the example partial electronic assembly 30 of FIG. 12 where the flex cable 31 is partially pulled through the second FPC connector 34 on the second board 35. FIG. 14 shows a side view of the example partial electronic assembly 30 of FIGS. 12 and 13 where the flex cable 31 is pulled fully through the second FPC connector 34 on the second board 35.

The flex cable 31 extending from the first FPC connector 32 on a first board 33 may be relatively short (e.g., less than 10 mm) as compared to conventional flex cable (e.g., larger than 25 mm) in order to facilitate fabrication of the partial electronic assembly 30. Fabrication of the partial electronic assembly 30 is facilitated because the flex cable 31 can be pulled from the opposite side of the second FPC connector 34 to the side where the flex cable 31 is inserted into the second FPC connector 34. FIG. 14 shows that the length of the flex cable 31 between the first FPC connector 32 on the first board 33 and the second FPC connector 34 on the second board 35 is minimized (see, e.g., dimension Y in FIG. 14) such that the partial electronic assembly 30 has the ability to maintain strong signal integrity between the first board 33 and the second board 35.

As shown in FIGS. 12-14, the partial electronic assembly 30 includes a first board 33 that includes a first FPC connector 32. A flexible cable 31 is secured within the first FPC connector 32.

The partial electronic assembly 30 further includes a second board 35 that includes a second FPC connector 34. The second FPC connector 34 includes a body 36 having a channel 37 extending through the body 36 such that the flexible cable 31 may be positioned in the channel 37 and pulled entirely through the body 35 of the second FPC connector 34. The second FPC connector 34 further includes a latching mechanism 38 (as described above) that secures the flexible cable 31 within the channel 37 once the flexible cable 31 is pulled through the second FPC connector 34.

In some forms, the first board 33 may an I/O board and/or the second board 35 may be a DCA electronic package. In addition, the channel 37 may be a rectangular-shaped opening, although other shapes for channel 37 are contemplated.

In the example form illustrated in FIGS. 12-14, the first board 33 includes an upper surface 39A such that the first FPC connector 32 is mounted on the upper surface 39A of the first board 33. In addition, the second board 35 includes an upper surface 39B such that the second FPC connector 34 is mounted on the upper surface 39B of the second board 35.

It should be noted the electronic assemblies 20, 30 described herein are not limited to the DCA package and I/O boards shown in the accompanying FIGS. Other electronic assemblies that may be used in a variety of computer system assemblies are contemplated, especially where FPC connectors are being used to form board to board electrical connections with flex cable.

The electronic assemblies 20, 30 described herein may achieve a compact design by using less flex cable for electrical connection. In addition, using less flex cable for electrical connection may provide improved signal integrity from one board to another.

FIG. 15 is a top view illustrating an example computer system assembly 40. The computer system assembly 40 includes a substrate 41 and a first board 42 mounted on the substrate 41. A flexible cable 43 is secured to the first board 42.

The computer system assembly 40 further includes a second board 44 mounted on the substrate 41. The second board 44 includes a FPC connector 45.

The FPC connector 45 includes a body 46 having a channel (not visible in FIG. 15) extending through the body 46 such that the flexible cable 43 may be positioned in the channel and pulled entirely through the body 46 of the FPC connector 45. The FPC connector 45 further includes a latching mechanism (as described above but not shown in FIG. 15) that secures the flexible cable 41 within the channel 47 once the flexible cable 43 is pulled through the FPC connector 45. The first board 42 and the second board 44 are moved closer together as the flex cable 43 is pulled through the FPC connector 45 before at least one of the first board 42 and the second board 44 are mounted on the substrate 41.

In some forms, the first board 42 may an I/O board and/or the second board 44 may be a DCA electronic package (other types of boards are contemplated). In addition, the channel may be a rectangular-shaped opening, although other shapes for channel are contemplated.

The computer system assembly 40 may further include a battery 48 mounted on the substrate 41. The computer system assembly 40 may allow for extra space to be gained on the substrate 41 because a shorter flex cable 43 (see, e.g., dimension Y in FIG. 15) may be used thereby increasing room for the battery 48 relative to given size substrate 41. Increasing room for the battery 48 may permit a desirable increase in the battery size/life, for the computer system assembly 40. Alternatively, the extra space on the substrate 41 may be used to fit an additional component on the substrate 41.

Figure 16:
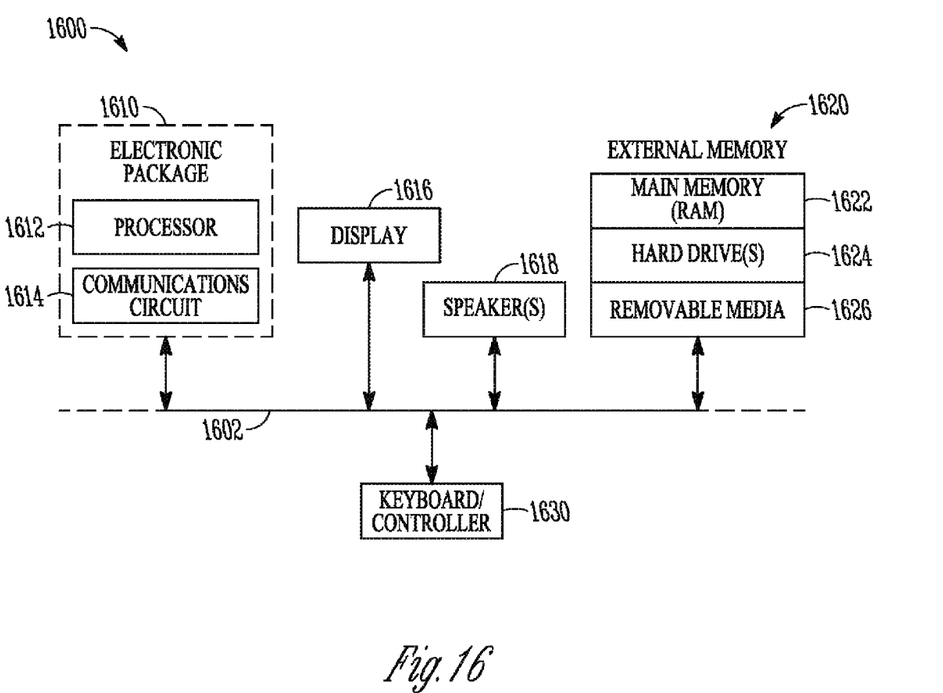
FIG. 16 is block diagram of an electronic apparatus that includes the electronic assemblies and/or the FPC connectors described herein.

FIG. 16 is a block diagram of an electronic apparatus 1600 incorporating at least one of the FPC connectors, electronic assemblies and/or computer system assemblies described herein. Electronic apparatus 1600 is merely one example of an electronic apparatus in which forms of the FPC connectors, electronic assemblies and/or computer system assemblies described herein may be used. Examples of an electronic apparatus 1600 include, but are not limited to, personal computers, tablet computers, mobile telephones, game devices, MP3 or other digital media players, etc.

In this example, electronic apparatus 1600 comprises a data processing system that includes a system bus 1602 to couple the various components of the electronic apparatus 1600. System bus 1602 provides communications links among the various components of the electronic apparatus 1600 and may be implemented as a single bus, as a combination of busses, or in any other suitable manner.

An electronic apparatus 1600 as describe herein may be coupled to system bus 1602. The electronic apparatus 1600 may include any circuit or combination of circuits. In one embodiment, the electronic apparatus 1600 includes a processor 1612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1600 are a custom circuit, an application-specific integrated circuit (ASIC), or the like, such as, for example, one or more circuits (such as a communications circuit 1614) for use in wireless devices like mobile telephones, tablet computers, laptop computers, two-way radios, and similar electronic systems. The IC can perform any other type of function.

The electronic apparatus 1600 may also include an external memory 1620, which in turn may include one or more memory elements suitable to the particular application, such as a main memory 1622 in the form of random access memory (RAM), one or more hard drives 1624, and/or one or more drives that handle removable media 1626 such as compact disks (CD), flash memory cards, digital video disk (DVD), and the like.

The electronic apparatus 1600 may also include a display device 1616, one or more speakers 1618, and a keyboard and/or controller 1630, which can include a mouse, trackball, touch pad, voice-recognition device, or any other device that permits a system user to input information into and receive information from the electronic apparatus 1600.

To better illustrate the FPC connectors, electronic assemblies and/or computer system assemblies disclosed herein, a non-limiting list of examples is provided herein:

Example 1 includes an FPC connector having a body that includes a channel extending through the body such that a flexible cable may be positioned in the channel and pulled entirely through the body of the FPC connector and a latching mechanism that is configured to secure the flexible cable within the channel once the flexible cable is pulled through the FPC connector.

Example 2 includes the FPC connector of example 1, wherein the channel is a rectangular-shaped opening.

Example 3 includes the FPC connector of any one of examples 1-2, wherein the latching mechanism includes a rotating member that secures the flexible cable.

Example 4 includes the FPC connector of any one of examples 1-3, wherein the latching mechanism is configured to apply a compressive force to a flexible cable positioned within the channel.

Example 5 includes an electronic assembly having a first board that includes a flexible cable within the first board and a second board that includes an FPC connector. The FPC connector includes a body having a channel extending through the body such that the flexible cable may be positioned in the channel and pulled entirely through the body of the FPC connector. The FPC connector further includes a latching mechanism that secures the flexible cable within the channel once the flexible cable is pulled through the FPC connector to bring the first board and second board together.

Example 6 includes the electronic assembly of example 5, wherein the first board is an I/O board.

Example 7 includes the electronic assembly of any one of examples 5-6, wherein the second board is a DCA electronic package.

Example 8 includes the electronic assembly of any one of examples 5-7, wherein the channel is a rectangular-shaped opening, and wherein the latching mechanism includes a rotating member that secures the flexible cable.

Example 9 includes the electronic assembly of any one of examples 5-8, wherein the latching mechanism applies a compressive force to the flexible cable positioned within the channel when the latching mechanism secures the flexible cable.

Example 10 includes the electronic assembly of any one of examples 5-9, wherein the first board and the second board move closer together as the flex cable is pulled through the FPC connector.

Example 11 includes an electronic assembly having a first board that includes a first FPC connector and a flexible cable secured within the first FPC connector. The electronic assembly further includes a second board having a second FPC connector. The second FPC connector includes a body having a channel extending through the body such that the flexible cable may be positioned in the channel and pulled entirely through the body of the second FPC connector. The second FPC connector further includes a latching mechanism that secures the flexible cable within the channel once the flexible cable is pulled through the second. FPC connector.

Example 12 includes the electronic assembly of example 11, wherein the first board is an I/O board.

Example 13 includes the electronic assembly of any one of examples 11-12, wherein the second board is a DCA electronic package.

Example 14 includes the electronic assembly of any one of examples 11-13, wherein the channel is a rectangular-shaped opening and the latching mechanism includes a rotating member that secures the flexible cable.

Example 15 includes the electronic assembly of any one of examples 11-14, wherein the latching mechanism applies a compressive force to the flexible cable positioned within the channel when the latching mechanism secures the flexible cable.

Example 16 includes the electronic assembly of any one of examples 11-15, wherein the first board and the second board move closer together as the flex cable is pulled through the FPC connector.

Example 17 includes the electronic assembly of any one of examples 11-16, wherein the first board includes an upper surface such that the first FPC connector is mounted on the upper surface of the first board, and wherein the second board includes an upper surface such that the second FPC connector is mounted on the upper surface of the second board.

Example 18 is a computer system assembly that includes a substrate and a first hoard mounted on the substrate. The computer system assembly further includes a flexible cable secured to the first board and a second board mounted on the substrate. The second board includes a FPC connector. The FPC connector includes a body having a channel extending through the body such that the flexible cable may be positioned in the channel and pulled entirely through the body of the FPC connector. The FPC connector further includes a latching mechanism that secures the flexible cable within the channel once the flexible cable is pulled through the FPC connector. The first board and the second board are moved closer together as the flex cable is pulled through the FPC connector before at least one of the first board and the second board is mounted on the substrate.

Example 19 includes the computer system assembly of example 18, wherein the first board is an I/O board and the second board is a DCA electronic package.

Example 20 includes the computer system assembly of any one of examples 18-19, and further including a battery mounted on the substrate.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein," Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:
1. An electronic assembly comprising:
 a first board that includes a flexible cable within the first board; and
 a second board that includes an FPC connector, the FPC connector including a body having a channel extending through the body such that the flexible cable may be positioned in the channel and pulled entirely through the body of the FPC connector, wherein the FPC connector further includes a latching mechanism that secures the flexible cable within the channel once the flexible cable is pulled through the FPC connector to bring the first board and the second board together.

2. The electronic assembly of claim 1, wherein the first board is an I/O board.

3. The electronic assembly of claim 2, wherein the second board is a DCA electronic package.

4. The electronic assembly of claim 1, wherein the channel is a rectangular-shaped opening, and wherein the latching mechanism includes a rotating member that secures the flexible cable.

5. The electronic assembly of claim 1, wherein the latching mechanism applies a compressive force to the flexible cable positioned within the channel when the latching mechanism secures the flexible cable.

6. The electronic assembly of claim 1, wherein the first board and the second board move closer together as the flex cable is pulled through the FPC connector.

7. An electronic assembly comprising:
a first board that includes a first FPC connector;
a flexible cable secured within the first FPC connector; and
a second board that includes a second FPC connector, the second FPC connector including a body having a channel extending through the body such that the flexible cable may be positioned in the channel and pulled entirely through the body of the second FPC connector, wherein the second FPC connector further includes a latching mechanism that secures the flexible cable within the channel once the flexible cable is pulled through the second FPC connector.

8. The electronic assembly of claim 7, wherein the first board is an I/O board.

9. The electronic assembly of claim 7, wherein the second board is a DCA electronic package.

10. The electronic assembly of claim 7, wherein the channel is a rectangular-shaped opening, and wherein the latching mechanism includes a rotating member that secures the flexible cable.

11. The electronic assembly of claim 10, wherein the latching mechanism applies a compressive force to the flexible cable positioned within the channel when the latching mechanism secures the flexible cable.

12. The electronic assembly of claim 7, wherein the first board and the second board move closer together as the flex cable is pulled through the second FPC connector.

13. The electronic assembly of claim 7, wherein the first board includes an upper surface such that the first FPC connector is mounted on the upper surface of the first board; and wherein the second board includes an upper surface such that the second FPC connector is mounted on the upper surface of the second board.

14. A computer system assembly comprising:
a substrate;
a first board mounted on the substrate;
a flexible cable secured to the first board; and
a second board mounted on the substrate, the second board including a FPC connector, the FPC connector including a body having a channel extending through the body such that the flexible cable may be positioned in the channel and pulled entirely through the body of the FPC connector, wherein the FPC connector further includes a latching mechanism that secures the flexible cable within the channel once the flexible cable is pulled through the FPC connector, and wherein the first board and the second board are moved closer together as the flex cable is pulled through the FPC connector before at least one of the first board and the second board is mounted on the substrate.

15. The computer system assembly of claim 14, wherein the first board is an I/O board, and wherein the second board is a DCA electronic package.

16. The computer system assembly of claim 14, further comprising a battery mounted on the substrate.

* * * * *